United States Patent [19]

Meadows et al.

[11] Patent Number: 5,412,579
[45] Date of Patent: May 2, 1995

[54] SLOW DISPLAY METHOD FOR DIGITAL OSCILLOSCOPE WITH FAST ACQUISITION SYSTEM

[75] Inventors: R. David Meadows, Portland; David H. Price, Hillsboro; Joseph H. Hubert, Portland, all of Oreg.

[73] Assignee: Tektronix, Inc., Wilsonville, Oreg.

[21] Appl. No.: 43,079

[22] Filed: Apr. 5, 1993

[51] Int. Cl.⁶ ............................................. G01R 23/16
[52] U.S. Cl. ........................ 364/487; 364/237.5; 364/259.1; 364/927.7; 395/135
[58] Field of Search ............ 364/481, 485, 487, 237.2, 364/237.3, 237.5, 259.1, 947.1, 927.2, 927.4, 927.66, 927.67, 927.7; 395/115, 116, 135; 324/76.15

[56] References Cited

U.S. PATENT DOCUMENTS

| | | |
|---|---|---|
| 4,251,754 | 2/1981 | Navarro et al. |
| 4,251,815 | 2/1981 | Dagostino . |
| 4,495,586 | 1/1985 | Andrews . |
| 4,510,571 | 4/1985 | Dagostino et al. |
| 4,647,862 | 3/1987 | Blair . |
| 4,809,189 | 2/1989 | Batson . |
| 4,829,293 | 5/1989 | Schlater ........................ 324/121 R |
| 4,979,122 | 12/1990 | Davis et al. ..................... 364/481 |
| 5,065,147 | 11/1991 | Rice et al. ....................... 364/521 |
| 5,134,337 | 7/1992 | Kongslie et al. . |
| 5,283,596 | 2/1994 | Long ............................. 345/134 |

*Primary Examiner*—Emanuel T. Voeltz
*Assistant Examiner*—Craig Steven Miller
*Attorney, Agent, or Firm*—Boulden G. Griffith

[57] ABSTRACT

The invention is a method for accumulating and displaying digital waveform data, representing the behavior over time of an electrical signal that includes the steps of: repeatedly acquiring and digitizing (10) waveform data during a first set of time intervals, repeatedly acquiring and digitizing (10) waveform data during a second set of time intervals, the second set of time intervals alternating with the first set of time intervals, during each one of the time intervals in the first set of time intervals, ORing (83) each acquired and digitized waveform together to produce first composite waveforms, during each one of the time intervals in the second set of time intervals, ORing (86) each acquired and digitized waveform together to produce second composite waveforms, displaying (81,84) each first composite waveform during a next occurring time interval in the second set of time intervals, and displaying (81,84) each second composite waveform during a next occurring time interval in the first set of time intervals. In a preferred embodiment, the ORing process is qualified on a pixel-by-pixel basis dependent on the results of a comparison between a randomly generated number and a predetermined threshold. In an alternative embodiment, only a single set of composite waveforms is produced and the display exhibits persistence to maintain the display during the next acquisition cycle.

7 Claims, 4 Drawing Sheets

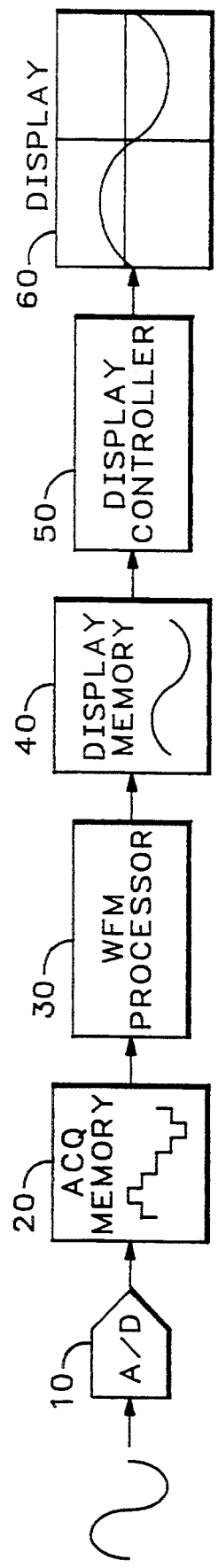
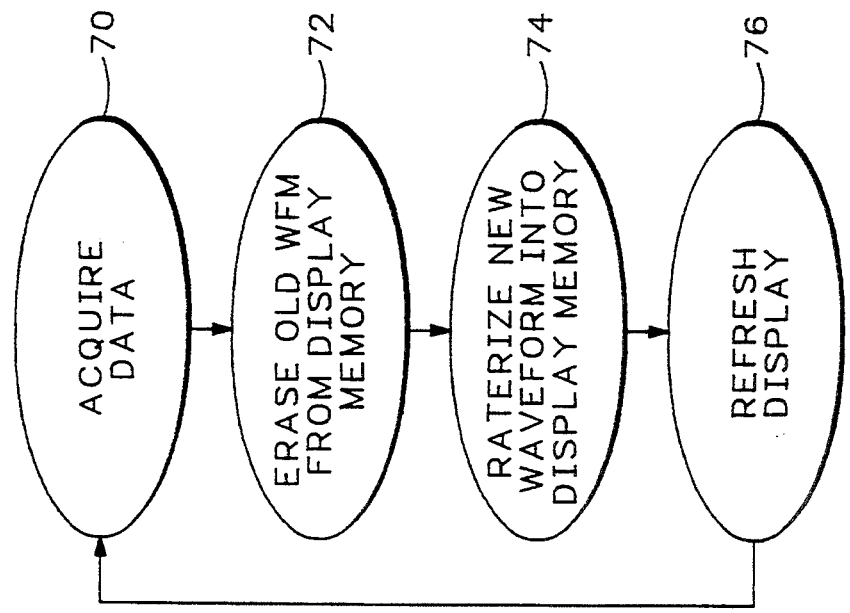
FIG. 1 (PRIOR ART)
FIG. 2 (PRIOR ART)

SLOW DISPLAY METHOD FOR DIGITAL OSCILLOSCOPE WITH FAST ACQUISITION SYSTEM

FILED OF THE INVENTION

This invention relates to the display of oscillographic information, and more particularly to a display method that can operate at very low refresh rates, but still include data from sources operating at a much higher acquisition rate.

BACKGROUND OF THE INVENTION

In typical analog oscilloscopes of the prior art the voltage versus time behavior of the signal being observed is presented in real time on a cathode ray tube (CRT) display. An electron beam is moved horizontally across the display at a constant rate that is determined by a timebase setting. As the electron beam moves horizontally at this constant rate, the time-varying voltage level of the signal being observed controls the vertical position of the electron beam.

Even though the electron beam may move far too quickly to be perceived by the human, repetitive signals can still be perceived because of the persistence that is inherent in the light emitted by the phosphor coating of the CRT. Typically, for a repetitive signal to be visible to a human observer, the sweep across the CRT must be repeated at least 20 times per second. The actual sweep speed can be much faster, e.g., 10,000 or more updates per second. Depending on how much or how little a "trigger holdoff" control is applied, the signal being monitored may actually be visible on the face of the CRT up to 90% of the time or more.

The analog system just described has, however, one major limitation which is important to the present discussion, i.e., that rare, anomalous, non-repetitive events will usually go completely undetected, since by definition they are not repetitive enough to appear on the display the 20 times per second that is necessary for perception by the human eye. To compensate for this limitation, the display can be enhanced by the use of an electron multiplying faceplate, such as the microchannel plate system described in U.S. Pat. No. 4,752,714 to Sonneborn et al. for "Decelerating and Scan Expansion Lens System for Electron Discharge Tube Incorporating a Microchannel Plate" and U.S. Pat. No. 5,134,337 to Kongslie et al. for a "Projection Lens Assembly for Planar Electron Source", both of which are hereby incorporated by reference. An analog oscilloscope having a display enhanced by this microchannel plate technology can amplify a rare event to make it visible, so that such an event remains perceptible to the human eye for more than a second after only a single occurrence.

Unfortunately, microchannel plate technology is relatively expensive and, because of the high beam intensities that it generates, it is also prone to causing damage to the CRT phosphor unless the CRT is protected from over-exposure to the beam. When the intensity of such a system is turned up to view a rarely occurring signal anomaly, protective circuitry designed to avoid CRT burning will automatically reduce the intensity to avoid damage. This automatic dimming during operation creates a tension between the operator's desires and the display system's limitations, and this can be irritating and frustrating to the user.

In digital oscilloscopes the signal whose behavior is being monitored is sampled at regular intervals and each of these samples is quantized as a digital number that can be stored and otherwise processed before it is displayed. FIG. 1 is a simplified block diagram illustrating the data flow in a conventional digital oscilloscope, and FIG. 2 is a flow chart showing how the blocks of FIG. 1 operate.

Referring first to FIG. 1, incoming analog waveform data is quantized into numerical values by analog-to-digital converter 10 at regular intervals determined by an acquisition clock signal. These numerical values are stored in acquisition memory 20 at locations corresponding to successive time increments. Waveform processor 30 performs any desired manipulations of this data, rasterizes it, and stores the results in display memory 40. Display controller 50 accesses the contents of the display memory 40 and presents the resulting waveform on display 60.

As shown in FIG. 2, data is first acquired 70, and the old waveform is erased 72 from the display 40. Data representing the new waveform is then rasterized 74 and stored in the display memory 40. Finally, the display is refreshed 76 and the process is repeated again.

In a first type of digital oscilloscope, the quantized sample values are processed as desired and then converted back to analog voltages for display on a conventional CRT. In this type of system the maximum display update rate is about 100 times per second because considerable processing and display time is associated with each display cycle. If the sweep speed of such an oscilloscope corresponds to 10,000 records per second, but only 100 of these potential records are actually processed and displayed, that means that only one percent of the signal's behavior is available for viewing by the operator and 99% is lost from view. Such a characteristic seriously detracts from any possibility of finding an intermittent event of interest.

In a second type of display system for digital oscilloscopes, the display is stored in a digital bit map and presented on a raster scanning CRT display without ever being converted back into an analog signal. In this type of system the maximum display update rate is about 70 times per second because even a larger portion of the time is devoted to processing the digital data for each acquisition. Thus, for sweep speeds corresponding to 10,000 records per second, less than one percent of the signal's actual activity is available for viewing by the oscilloscope operator, so the chances of finding random anomalous signal behaviors is very small and when such behaviors are captured they are not visible to the human eye unless they happen to be stored and held for non-realtime viewing. The bit map type display can be made to behave more like a conventional analog CRT type display by causing the contents of the bit map to decay over time as newly acquired signal traces are added to it.

All of the display systems described above utilized cathode ray tube display systems, either to paint analog vectors or to provide a raster scan display. Yet, for many applications, newer display technologies are replacing the traditional CRT. Many of these newer display technologies provide a more rugged and compact alternative to the relatively fragile and bulky CRT.

Unfortunately, the newer display technologies that are currently available tend to be much slower than the CRTs that they replace. For example, liquid crystal displays (LCDs) now available are typically only able to be updated five times per second, i.e, only once every 200 ms. If a single newly acquired waveform is displayed with each such update, a very high percentage of the total sweeps that occur at even relatively slow sweep speeds will be lost during the interval between successive occurrences of these very slow display updates.

It would be highly desirable to have a way to provide oscilloscope users with much more information from all of the sweeps made by a fast quantizing data acquisition system, while at the same time providing the benefits associated with the more rugged and compact alternative display technologies now available. The invention described below provides such an oscilloscope display system and method.

SUMMARY OF THE INVENTION

The invention is a method for accumulating and displaying digital waveform data representing the behavior over time of an electrical signal that includes the steps of: repeatedly acquiring and digitizing waveform data during a first set of time intervals, repeatedly acquiring and digitizing waveform data during a second set of time intervals, the second set of time intervals alternating with the first set of time intervals, during each one of the time intervals in the first set of time intervals, ORing each acquired and digitized waveform together to produce first composite waveforms, during each one of the time intervals in the second set of time intervals, ORing each acquired and digitized waveform together to produce second composite waveforms, displaying each first composite waveform during a next occurring time interval in the second set of time intervals, and displaying each second composite waveform during a next occurring time interval in the first set of time intervals. In a preferred embodiment, the ORing process is qualified on a pixel-by-pixel basis dependent on the results of a comparison between a randomly generated number and a predetermined threshold. In an alternative embodiment, only a single set of composite waveforms is produced and the display exhibits persistence to maintain the display during the next acquisition cycle.

BRIEF DESCRIPTION OF THE DRAWINGS

FIG. 1 is a simplified block diagram illustrating the data flow in a conventional digital oscilloscope.

FIG. 2 is a flow chart showing how the blocks of FIG. 1 operate in a conventional digital oscilloscope.

DETAILED DESCRIPTION OF THE INVENTION

Figure 3:
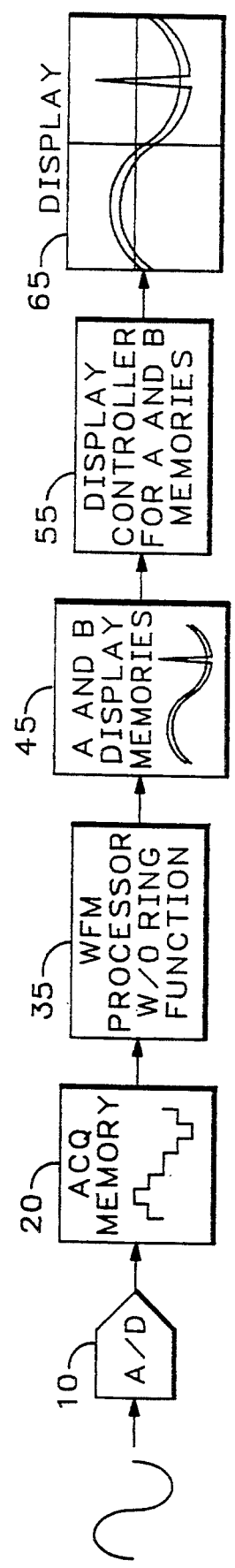
FIG. 3 is a simplified block diagram illustrating the data flow in a digital oscilloscope according to the present invention.
Figure 4:
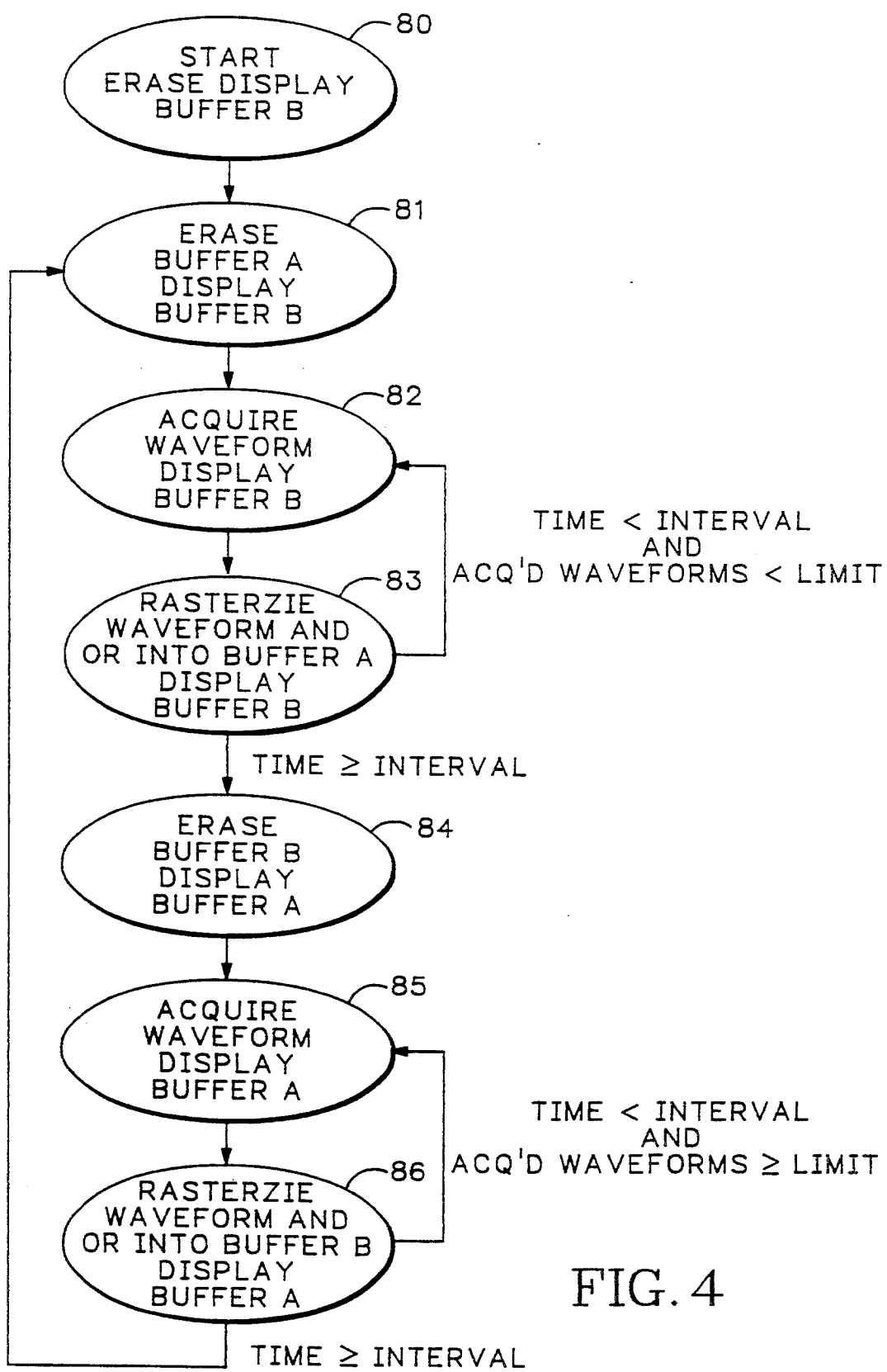
FIG. 4 is a flow chart showing how the blocks of FIG. 3 operate in a digital oscilloscope according to the present invention.

The data flow in a digital oscilloscope according to the present invention is shown in FIG. 3. FIG. 4 is a flow chart showing how the blocks of FIG. 3 operate according to the present invention. The analog-to-digital converter 10 and acquisition memory 20 are the same as in a conventional digital oscilloscope, such as the one illustrated in FIGS. 1 and 2. The waveform processor with an ORing function 35 shown in FIG. 3 is different from the waveform processor 30 shown in FIG. 1. And, the A and B display memories 45 shown in FIG. 3 contains two frame buffer memories, instead of the single frame buffer memory contained in the display memory 40 shown in FIG. 1. As will be further described below, the waveform processor with an ORing function 35 contains means for ORing the newly acquired waveform with the one previously stored in one of the frame buffer memories A or B. The display controller for A and B memories 55 alternately displays the contents of one frame buffer memory and then the other (known as alternating double buffering). While the contents of the A memory are being displayed, the B memory contents are being updated by the waveform processor with an ORing function.

Referring now to FIG. 4, operation commences with the erasure of buffer B 80. The contents of buffer B is then displayed and buffer A is erased 81. While the contents of buffer B are still being displayed, waveforms are acquired 82, rasterized 83, and ORed into buffer A 83. Steps 82 and 83 are repeated until the end of a time interval determined by the display system's maximum effective update rate, e.g., 200 ms, or until a selected number of waveforms have been acquired.

When the time that-the contents of buffer B has been displayed becomes equal to or greater than the specified interval, buffer B is erased and buffer A is displayed 84. Another loop is then entered during which buffer A is continuously displayed while additional waveforms are acquired 85, rasterized 86, and ORed into buffer B 86. This process continues for the duration of the time interval or until the desired number of waveforms have been acquired. When the time interval has again expired, buffer A is erased and buffer B is again displayed 81. This cycle of alternation between buffers A and B continues indefinitely for as long a display is desired.

Even though it reduces the percentage of time that the input signal is actively monitored, limiting the number of waveforms acquired during each display cycle time interval can provide user advantages under some circumstances. In particular, when the input signal has low amplitude and is noisy, a much cleaner display can be obtained by limiting the number of acquisitions per display cycle.

Because liquid crystal displays cannot generally accommodate grey scale values when operating at full speed, but rather only provide pixels that are all dark or all light, simple ORing produces a completely lighted waveform for both frequently repeated waveforms and for transient waveforms that only occur once. Since the user would like to be able to discriminate between frequently occurring and rarely occurring waveforms, the ORing function can be modified to permit such discrimination.

The ORing function can be modified to only occur when a randomly generated number exceeds a predetermined threshold value on a pixel-by-pixel basis. The fact that the modification is controlled by a number which is randomized on a pixel-by-pixel basis serves to prevent aliasing. A linear feedback shift register is a suitable source of a pseudo-random number to be used for this purpose. The predetermined threshold can be changed to make a higher or lower percentage of points on each waveform visible. The lower the percentage of points on a particular waveform that are displayed, the lower the apparent intensity of spurious waveform excursions and the greater their contrast with frequently occurring waveform data.

During the process of randomly selecting out some percentage of the points in each waveform, the probability of illuminating a particular pixel along the waveform must be kept constant for all points. In particular, if the sample point to raster interpolation algorithm produces as part of its output both of the end points that were its inputs, along with all of the intermediate points that it finds by interpolation, all of the endpoints (except those at the very edges of the display) will have twice the probability of being illuminated that the interpolated points have. This phenomenon also produces undesirable visual effects. The standard Bresenham's algorithm for linear interpolation had to be modified to eliminate one end point from each output segment that is not at the ends of the display space.

Although the motivation for this invention arose from the speed limitations inherent in liquid crystal displays, the resulting approach is nonetheless useful even when faster displays are available. This is because a cumulative display with a slow update rate allows the user to see and react to events whose fleeting nature would otherwise prevent their perception. An update rate of 200 ms is slow enough to permit the average human being to respond to a visual cue and freeze the display before the image changes.

Furthermore, while it is generally desirable to have two frame buffers operating in alternation to provide a continuous display, the invention can still be useful when only a single display memory is employed, as long as the display device is capable of providing as least some persistence. Referring again to FIG. 3, if a single display memory 45' is substituted for A and B display memories 45, and a display 65' with inherent persistence is substituted for display 65, then the procedure shown in FIG. 5 can be followed to produce a display that is suitable for applications.

Figure 5:
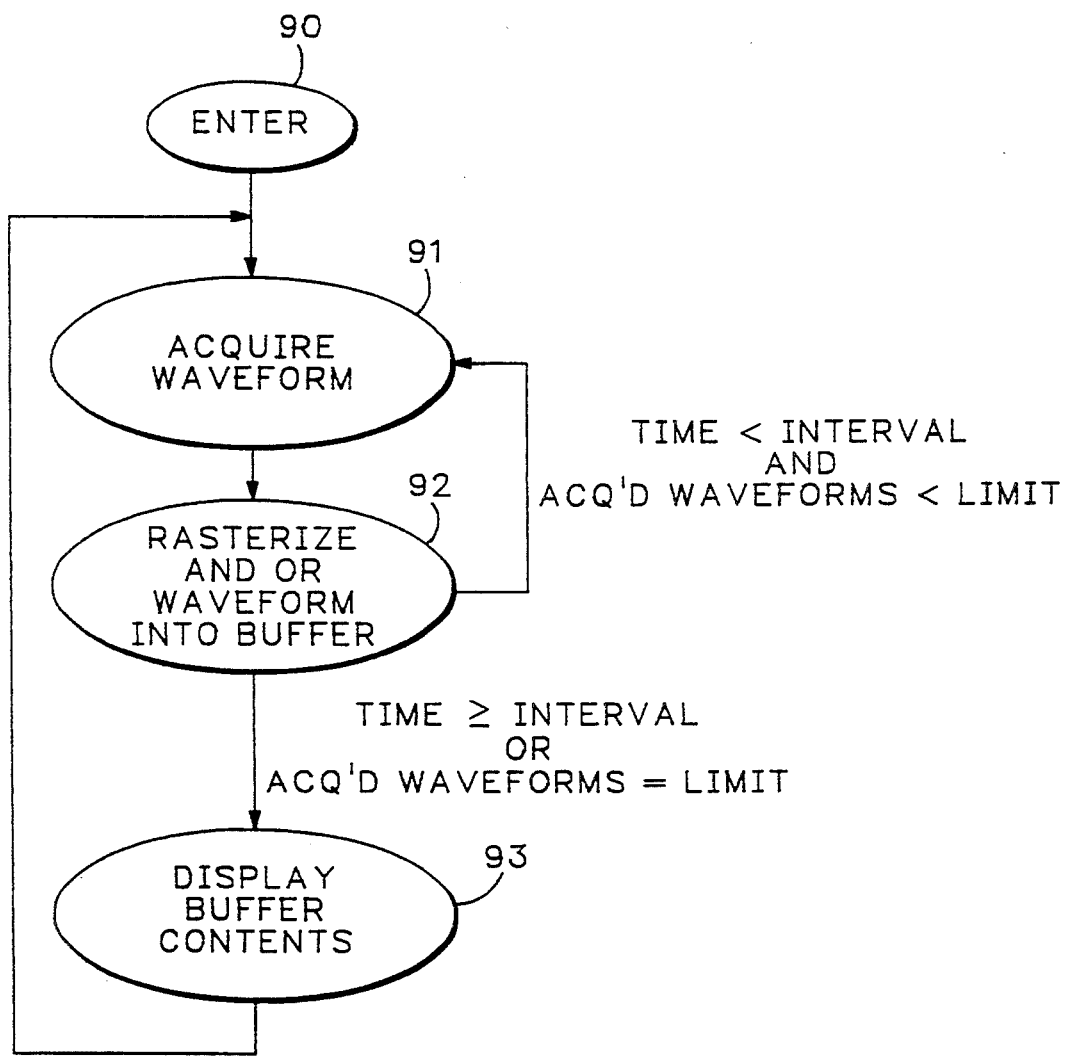
FIG. 5 is a flow chart showing how the invention may be implemented with a single display memory and a display that exhibits persistence.

Referring now to FIG. 5, after this mode of operation is entered 90, waveforms are acquired 91 and rasterized and ORed 92 into a (single) buffer. This process continues for a predetermined number of waveform acquisitions or until a time interval expires. When the time interval is over or the desired number of waveforms have been acquired, the contents of buffer are displayed 93 and a new cycle 91,92 of waveform acquisition is initiated. If the time interval or limit on the number of waveforms acquired results in a short enough acquisition interval, the persistence of the display device can maintain a display which is perceived as adequate by the operator.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope and spirit of the invention.

We claim:

1. A method for accumulating and displaying digital waveform data, the data representing the behavior over time of an electrical waveform, the method comprising the steps of:
    repeatedly acquiring and digitizing waveform data during a time interval;
    ORing each acquired and digitized waveform together to produce a composite waveform;
    qualifying the occurrence of the ORing step with a probability function on a pixel-by-pixel basis; and
    displaying the composite waveform using a display means having at least some persistence.

2. A method according to claim 1 wherein the qualifying step comprises the steps of:
    predetermining a threshold value;
    on a pixel-by-pixel basis, generating a random number;
    comparing the randomly generated number with the predetermined threshold; and
    on a pixel-by-pixel basis, ORing the waveform data associated with each pixel into the composite waveform based on an outcome of the comparing step.

3. A method according to claim 1 wherein the time interval is determined by the time required to acquire a predetermined number of waveforms.

4. A method for accumulating and displaying digital waveform data, the data representing the behavior over time of an electrical waveform, the method comprising the steps of:
    (a) repeatedly acquiring and digitizing waveform data during a first set of time intervals;
    (b) repeatedly acquiring and digitizing waveform data during a second set of time intervals, the second set of time intervals alternating with the first set of time intervals;
    (c) during each one of the time intervals in the first set of time intervals, ORing each acquired and digitized waveform together to produce first composite waveforms;
    (d) qualifying on a pixel-by-pixel basis the execution of step (c) with a probability function;
    (e) during each one of the time intervals in the second set of time intervals, ORing each acquired and digitized waveform together to produce second composite waveforms;
    (f) qualifying on a pixel-by-pixel basis the execution of step (e) with a probability function;
    (g) displaying each first composite waveform during a next occurring time interval in the second set of time intervals; and
    (h) displaying each second composite waveform during a next occurring time interval in the first set of time intervals.

5. A method according to claim 4 wherein the qualifying step comprises the steps of:
    predetermining a threshold value;
    on a pixel-by-pixel basis, generating a random number;
    comparing the randomly generated number with the predetermined threshold; and
    on a pixel-by-pixel basis, ORing the waveform data associated with each pixel into the composite waveform based on an outcome of the comparing step.

6. A method according to claim 4 wherein the first and second sets of time intervals substantially cover all operating times.

7. A method according to claim 4 wherein the duration of the time intervals is determined by the time required to acquire a predetermined number of waveforms.

* * * * *